Figure 1:
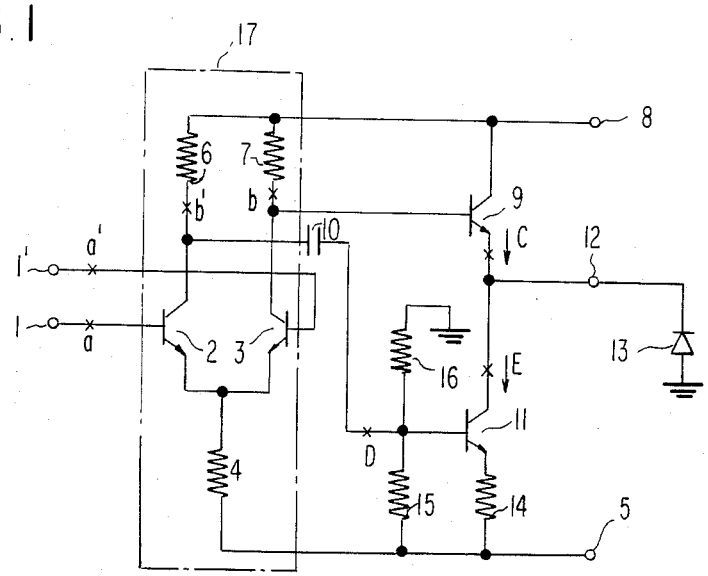

United States Patent [19]

Fujita

[11] Patent Number: 4,533,838
[45] Date of Patent: Aug. 6, 1985

[54] DIODE DRIVER CIRCUIT HAVING STORED CHARGE CONTROL MEANS

[75] Inventor: Toshio Fujita, Tokyo, Japan

[73] Assignee: Nippon Electric Co., Ltd., Tokyo, Japan

[21] Appl. No.: 446,307

[22] Filed: Dec. 3, 1982

[30] Foreign Application Priority Data

Dec. 18, 1981 [JP] Japan ................................ 56-205950

[51] Int. Cl.³ .............................................. H03K 17/00
[52] U.S. Cl. .................................. 307/270; 307/247 R; 307/319
[58] Field of Search ............... 307/270, 247, 319, 297, 307/300, 289, 565

[56] References Cited

U.S. PATENT DOCUMENTS 4,132,906  1/1979  Allen ..................................... 307/300
4,251,742  2/1981  Beelitz .................................. 307/270
4,253,035  2/1981  Amitay ................................. 307/270

Primary Examiner—Stanley D. Miller
Assistant Examiner—B. P. Davis
Attorney, Agent, or Firm—Sughrue, Mion, Zinn, Macpeak, and Seas

[57] ABSTRACT

A diode driver circuit having low power consumption. A differential amplifier (17) receives phase inverted signals (a, a'). During a first phase switch, a low impedance circuit (9) is driven to provide a reverse voltage which switches the driven diode (13) from forward bias to reverse bias while discharging the forward charge stored therein. During this time, the constant current circuit (11) is cut off due to the charging of the capacitor (10). When a second phase switch occurs, the capacitor (10) discharges, causing the constant current circuit (11) to provide an excess current which discharges the reverse stored charge of diode (13) and switches the diode from reverse bias back to forward bias.

6 Claims, 6 Drawing Figures

DIODE DRIVER CIRCUIT HAVING STORED CHARGE CONTROL MEANS

BACKGROUND OF THE INVENTION

The present invention relates to an improvement in diode driver circuits utilized to drive P-I-N diodes, Schottkey diodes or the like which are used in phase modulators, a diode switches or the like, and more particularly, to a high-speed diode driver circuit having low power consumption.

A P-I-N diode having a high reverse voltage and a low forward impedance is used in high-power phase modulators, diode switches and the like. However, since the minority carriers or charges are accumulated in the I layer of a P-I-N diode during the period of forward bias, the diode deteriorates in high-speed response. For this reason, a high-speed P-I-N diode driver circuit must cancel the accumulated carrier in a short period of time when the diode is reverse biassed after being forward biassed. Conversely, when the diode is forward biassed after being reverse biassed, the charges accumulated in the junction barrier during the period of reverse bias must be quickly removed. This function is also required to be produced by a high-speed P-I-N diode driver circuit.

One of the conventional driver circuits having these functions is disclosed in the U.S. Pat. No. 3,922,570 granted to the same applicant on a "Driver Circuit for Modulating Diode". In this circuit, a constant current circuit and a low impedance circuit are connected to a P-I-N diode. When the diode is forward biassed the transistor of the low-impedance circuit is cut off and a constant bias current is supplied from the constant current circuit. When the P-I-N diode is switched so that it is reverse biassed, a large current is supplied from the low impedance circuit to the P-I-N diode to discharge the charges accumulated therein in a short period of time, to thereby achieve high switching speed. This circuit, though excelling in speed, requires a large current to be supplied to the switching transistor. Specifically the current needed to discharge the charges in the junction barrier is fed to the switching transistor by way of a diode connected to the base and the emitter of the transistor of the low impedance circuit. Therefore, this switching current does not permit ready reduction of either power consumption or hardware size.

SUMMARY OF THE INVENTION

It is, accordingly, an object of the present invention to provide a high-speed diode driver circuit having low power consumption, said driver being readily reduced in size.

In one aspect of the invention, a diode driver circuit comprises switching means responsive to an input signal, a diode means for modulation or switching, a low impedance circuit means connected to the switching means and the diode means for feeding a reverse voltage to the diode means in response to the output of the switching means, and a constant current circuit means connected to the diode means for supplying a current in the forward direction to the diode means. The constant current circuit means includes means for supplying an excess current for only the period of time in which the diode means is switched from reverse to forward bias.

BRIEF DESCRIPTION OF THE INVENTION

The invention will be described hereunder with reference to the accompanying drawings, wherein:

FIG. 1 illustrates one embodiment of the diode driver circuit according to the invention; and FIGS. 2A to 2E are time charts showing the voltage or current waveforms at points A to E, respectively, of FIG. 1.

PREFERRED EMBODIMENT OF THE INVENTION

The diode driver circuit of the present invention shown in FIG. 1 is, for example, used for the phase modulator illustrated in FIG. 1 of the aforementioned U.S. Pat. No. 3,922,570. In FIG. 1, herein an input terminal 1 is connected to the base of a transistor 2, and another input terminal 1' is connected to the base of another transistor 3. Inverted phase signals are fed to the input terminals 1 and 1' respectively. The emitters of the transistors 2 and 3 are connected to one side of a resistor 4. The other side of the resistor 4 is connected to a negative power supply terminal 5. The collectors of the transistors 2 and 3 are connected to a positive power supply terminal 8 by way of resistors 6 and 7, respectively. The collector of transistor 3 is further connected to the base of a transistor 9. The collector transistor 2 is connected to the base of a transistor 11 by way of a capacitor 10. The collector of the transistor 9 is connected to the positive power supply terminal 8, and the emitter thereof is connected to the collector of the transistor 11. The emitter of transistor 9 is also connected to the cathode of a P-I-N diode 13 by way of an output terminal 12. The emitter of the transistor 11 is connected to the negative power supply terminal 5 by way of a resistor 14. The base of the transistor 11 is connected to the negative power supply terminal 5 by way of a resistor 15, and is also grounded by way of a resistor 16. The anode of the P-I-N diode 13 is grounded.

In this circuit, driving signals fed to the signal input terminals 1 and 1' are amplified by a differential pulse amplifier 17 which is composed of the transistors 2 and 3 and the resistors 6, 7 and 4. One side of the output of the differential pulse amplifier 17 is taken from the collector of the transistor 3 and is fed to the base of the transistor 9. The other side of the output of the differential pulse amplifier 17 is taken from the collector of the transistor 2 and is fed to the base of the transistor 11 by way of the capacitor 10. The transistor 9 operates as a low impedance circuit, and the transistor 11 (being driven with a suitable potential at its base), operates as a constant current circuit.

If the low level output voltage of the differential pulse amplifier 17 is set to be slightly negative when the P-I-N diode is forward biassed, the transistor 9 will be cut off and the current supplied from the transistor 11 will flow to the P-I-N diode 13, to which a constant current (1 mA for instance) in the forward direction will flow under steady state conditions.

Figure 2A:
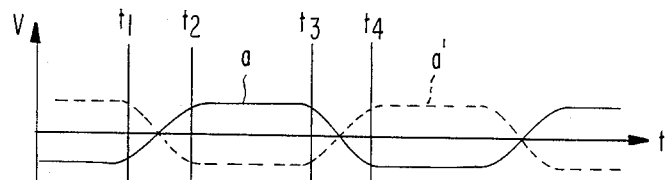
Figure 2B:
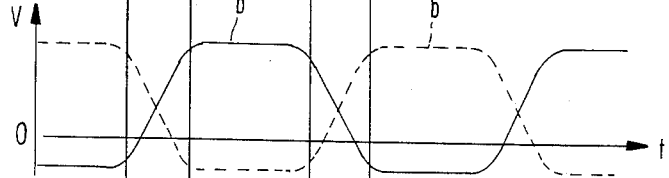
Figure 2C:
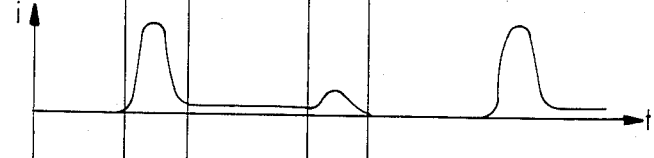

The specific aspects of the operation of the circuit of the invention will be described in further detail below. FIG. 2A shows the voltage waveforms of the pulses fed to the input terminals 1 and 1', a solid line a representing the pulse given to the input terminal 1 and a dotted line a' representing the pulse given to the input terminal 1'. These pulses a and a' are amplified by the differential pulse amplifier 17 as illustrated in FIG. 2B, where a solid line b represents the output voltage at the collector of the transistor 3 and a dotted line b', represents the output voltage at the collector of the transistor 2. Before time point $t_1$ in FIG. 2B, a charge proportional to the forward current is accumulated in the P-I-N diode 13. The time period between time point $t_1$ and time point $t_2$ is a transitional period, during which the P-I-N diode is switched in bias forward to reverse. During this time period, the base voltage of the transistor 9 is switched from negative to positive to turn "on" the transistor 9 and, as shown in FIG. 2C, a large current (100 mA for instance) flows so that the charge of the P-I-N diode 13 is quickly discharged to turn "off" the P-I-N diode 13.

Figure 2D:
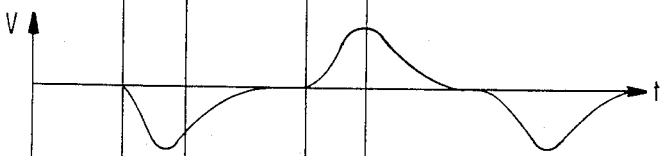
Figure 2E:
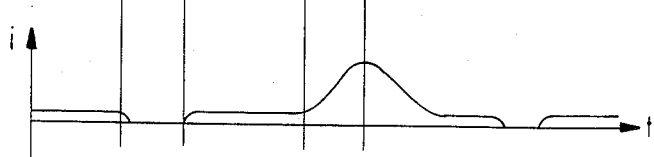

Meanwhile, a voltage represented by b' in FIG. 2B is supplied to the base of the transistor 11 by way of the capacitor 10, whose value is selected such that the voltage fed to the base of the transistor 11 has a differential waveform as shown in FIG. 2D. In this instance, the current waveform of the transistor 11 is as illustrated in FIG. 2E. Specifically, note that during the first transition time period, the transistor 11 is substantially cut off to accelerate the discharging of the P-I-N diode 13.

A second transition time period (i.e. from time point $t_3$ to time point $t_4$) is the transitional period during which the P-I-N diode 13 is switched or biassed in direction from reverse to forward. The emitter voltage of the transistor 9 changes from positive to negative along with the variation of the base voltage thereof such that the transistor 9 is cut off at time $t_4$. Meanwhile, the transistor 11 supplies a large current from time $t_3$ to time $t_4$ (and a short period of time thereafter) to discharge the charge of the P-I-N diode 13 attributable to the junction barrier capacitance. At the same time, the charge in the I layer of the P-I-N diode 13 is quickly brought back to its steady state valve.

In this manner, the charge within the P-I-N diode 13 is substantially constant irrespective of the length of time from the point of time $t_4$ to the next change in bias direction from forward to reverse. Therefore, the current supplied from the transistor 9 to the P-I-N diode 13 when the biassing direction is switched from forward to reverse remains constant, resulting in a switching performance susceptible to negligible jitter or other undesirable transients.

Furthermore, it is sufficient for the output amplitude of the differential pulse amplifier 17 to be only slightly greater than that of the reverse voltage fed to the P-I-N diode 13. In addition, the currents flow to the transistors 9 and 11 virtually solely during the transitional periods of switching, so that the power consumption is quite small. The current of the P-I-N diode 13 in the forward direction in its steady state is normally smaller than the transitional currents at the switching points.

As hitherto described, the present invention provides a high-speed P-I-N diode driver circuit of low power consumption which can be readily reduced in size.

What is claimed is:

1. A diode driver circuit comprising: switching means responsive to an input signal, a diode means for modulation or switching, said diode means having a forward bias state and a reverse bias state, a low impedance circuit means connected to said switching means and said diode means for feeding a reverse voltage to said diode means in response to a first output of said switching means to switch said diode means from said forward bias state to said reverse bias state, and a constant current circuit means connected to said diode means for supplying a current in the forward direction to said diode means, said constant current circuit means including means responsive to a second output of said switching means for supplying an excess current for only a period of time in which said diode means is switched from said reverse bias state to said forward bias state.

2. The diode driver circuit means as recited in claim 1, wherein said constant current circuit means substantially cuts off in response to said first output of said switching means.

3. The diode driver circuit means as recited in claim 1, wherein said constant current circuit means comprises a transistor having an emitter, a base and a collector, and first biasing means for providing a constant bias to said base of said transistor, and second biasing means for providing a voltage having the differential waveform of said second output of said switching means to said base of said transistor.

4. The diode driver circuit as recited in claim 3, wherein said biassing means provides a voltage having a differential waveform to said base of said transistor.

5. The diode driver circuit as recited in claim 3, wherein said biasing means comprises a capacitor.

6. The diode driver circuit as recited in claim 1, wherein said switching means comprises a differential amplifier having first and second transistors, each of said transistors having an emitter, a base and a collector, said emitters of said transistors being interconnected and said bases of said transistors receiving said input signal, wherein said collector of said first transistor is connected to said low impedance circuit means and said collector of said second transistor is connected to said constant current circuit means.

* * * * *

UNITED STATES PATENT AND TRADEMARK OFFICE
CERTIFICATE OF CORRECTION

PATENT NO.   : 4,533,838
DATED        : August 6, 1985
INVENTOR(S)  : Toshio FUJITA It is certified that error appears in the above-identified patent and that said Letters Patent is hereby corrected as shown below:

Column 1, line 48, before "switching" insert -- high --;

Column 2, line 27, after "collector" insert -- of --;

Column 3, line 7, after "bias" insert -- from --;

Column 3, line 37, after "constant" insert -- , --;

Column 4, line 40, Claim 5, after "said" insert -- second --.

Signed and Sealed this

Eleventh Day of February 1986

[SEAL]

Attest:

Attesting Officer

DONALD J. QUIGG

Commissioner of Patents and Trademarks